(12) United States Patent
Koini et al.

(10) Patent No.: US 11,342,126 B2
(45) Date of Patent: May 24, 2022

(54) ELECTRICAL COMPONENT AND A METHOD FOR PRODUCING AN ELECTRICAL COMPONENT

(71) Applicant: Epcos AG, Munich (DE)

(72) Inventors: Markus Koini, Seiersberg (AT); Jürgen Konrad, Graz (AT); Franz Rinner, Deutschlandsberg (AT); Markus Puff, Graz (AT); Monika Stadlober, Graz (AT); Georg Kügerl, Eibiswald (AT); Thomas Wippel, Stainz (AT)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 15/553,430

(22) PCT Filed: Dec. 21, 2015

(86) PCT No.: PCT/EP2015/080853
§ 371 (c)(1),
(2) Date: Aug. 24, 2017

(87) PCT Pub. No.: WO2016/134804
PCT Pub. Date: Sep. 1, 2016

(65) Prior Publication Data
US 2018/0247768 A1    Aug. 30, 2018

(30) Foreign Application Priority Data
Feb. 27, 2015    (DE) .......................... 102015102866.2

(51) Int. Cl.
*H01G 4/38*    (2006.01)
*H01G 2/06*    (2006.01)
(Continued)

(52) U.S. Cl.
CPC ............... *H01G 4/38* (2013.01); *H01G 2/06* (2013.01); *H01G 4/228* (2013.01); *H01G 4/232* (2013.01);
(Continued)

(58) Field of Classification Search
CPC .......... H01G 4/38; H01G 4/228; H01G 4/232; H01G 4/2325; H01G 4/248; H01G 4/30;
(Continued)

(56) References Cited

U.S. PATENT DOCUMENTS 2,965,812 A * 12/1960 Bedford, Jr. ............. H01R 9/28
                                                              361/774
3,022,480 A *  2/1962 Emery .................... H02B 1/207
                                                              439/45
(Continued)

FOREIGN PATENT DOCUMENTS

CN          1585055 A       2/2005
CN        101599365 A      12/2009
(Continued)

OTHER PUBLICATIONS

Epcos AG: "CeraLink™ capacitor for fast-switching semiconductors—low profile (LP) series," downloaded at http://www.epcos.com/inf/20/10/ds/B5803115105M002_LP.pdf, Version 1.2, Feb. 19, 2015, pp. 1-18 (18 pages).
(Continued)

*Primary Examiner* — Paresh Paghadal
(74) *Attorney, Agent, or Firm* — Nixon Peabody LLP (57) ABSTRACT

An electrical component having partial bodies, a base on which the partial bodies are arranged, and at least one connection contact for electrically connecting the partial bodies to a carrier. A method for producing an electrical component having one or more partial bodies is also disclosed.

14 Claims, 4 Drawing Sheets

(51) Int. Cl.
  *H01G 4/232* (2006.01)
  *H01G 4/228* (2006.01)
  *H01G 4/30* (2006.01)
  *H05K 1/18* (2006.01)
  *H01G 4/248* (2006.01)
  *H01R 43/26* (2006.01)

(52) U.S. Cl.
  CPC .............. *H01G 4/248* (2013.01); *H01G 4/30* (2013.01); *H01R 43/26* (2013.01); *H05K 1/181* (2013.01); *H05K 2201/10015* (2013.01); *H05K 2201/10757* (2013.01); *H05K 2201/10818* (2013.01); *H05K 2201/10909* (2013.01)

(58) Field of Classification Search
  CPC .. H01G 4/26; H01G 2/06; H05K 2201/10015; H05K 2201/10757; H05K 2201/10818; H05K 2201/10909; H05K 1/181
  See application file for complete search history.

(56) References Cited

U.S. PATENT DOCUMENTS

| | | | | |
|---|---|---|---|---|
| 3,082,397 | A * | 3/1963 | Clarkson | H01R 33/05 439/638 |
| 3,328,749 | A * | 6/1967 | Kukla | H01R 9/16 439/389 |
| 3,701,075 | A * | 10/1972 | Schullstrom | H05K 7/10 439/525 |
| 3,780,431 | A * | 12/1973 | Feeney | H05K 3/0052 29/830 |
| 3,846,740 | A * | 11/1974 | Damon | H05K 7/1015 439/701 |
| 3,866,999 | A * | 2/1975 | Doherty, Jr. | H05K 3/3468 361/767 |
| 4,072,376 | A * | 2/1978 | Shannon | H05K 7/1053 439/590 |
| 4,216,523 | A * | 8/1980 | Harford | H01R 23/70 29/402.08 |
| 4,293,890 | A | 10/1981 | Varsane | |
| 4,404,744 | A * | 9/1983 | Stenz | B29C 45/14639 264/272.14 |
| 4,570,031 | A | 2/1986 | Inoue | |
| 4,571,662 | A | 2/1986 | Conquest et al. | |
| 4,578,736 | A | 3/1986 | Brown | |
| 4,617,609 | A | 10/1986 | Utner | |
| 4,832,622 | A * | 5/1989 | Zahn | B29C 45/0003 29/874 |
| 4,884,335 | A * | 12/1989 | McCoy | H05K 3/34 29/839 |
| 5,242,097 | A * | 9/1993 | Socha | B23K 35/0222 228/246 |
| 5,402,321 | A | 3/1995 | Izu et al. | |
| 5,548,473 | A * | 8/1996 | Wang | H01G 4/224 361/301.1 |
| 5,712,758 | A | 1/1998 | Amano | |
| 5,830,012 | A * | 11/1998 | Ortega | B29C 45/0003 439/590 |
| 5,834,084 | A * | 11/1998 | Maggio | H05K 1/189 428/64.1 |
| 5,842,274 | A * | 12/1998 | Modl | H05K 3/3485 29/840 |
| 5,945,732 | A | 8/1999 | Burns | |
| 5,957,739 | A * | 9/1999 | Bianca | H01R 43/16 439/876 |
| 6,081,416 | A | 6/2000 | Trinh | |
| 6,346,127 | B1 | 2/2002 | Kuriyama | |
| 6,595,788 | B2 * | 7/2003 | Harper, Jr. | H01R 13/514 439/590 |
| 6,885,538 | B1 * | 4/2005 | Ishii | H01G 2/06 361/301.3 |
| 6,924,967 | B1 * | 8/2005 | Devoe | H01G 2/065 29/856 |
| 6,976,855 | B2 * | 12/2005 | Kennedy | H01R 43/0235 439/83 |
| 7,331,799 | B1 | 2/2008 | Lee | |
| 7,450,366 | B2 | 11/2008 | Kuriyama | |
| 7,570,479 | B2 * | 8/2009 | Lin | H01G 9/08 361/535 |
| 7,719,822 | B2 * | 5/2010 | Kodera | H01G 9/008 361/520 |
| 7,766,499 | B2 * | 8/2010 | Park | F21V 19/0025 361/760 |
| 7,916,457 | B2 * | 3/2011 | Horio | H01G 9/012 361/541 |
| 8,873,219 | B2 * | 10/2014 | Perea | H01C 1/14 361/303 |
| 9,198,295 | B2 | 11/2015 | Lhommeau | |
| 9,474,145 | B2 * | 10/2016 | Kim | H01L 25/105 |
| 9,502,612 | B2 * | 11/2016 | Margalit | H01L 33/382 |
| 2002/0054470 | A1 * | 5/2002 | Kuriyama | H01G 2/065 361/302 |
| 2003/0011959 | A1 * | 1/2003 | Moriwaki | H01G 4/232 361/308.1 |
| 2005/0041367 | A1 | 2/2005 | Yoshii | |
| 2009/0133904 | A1 * | 5/2009 | Koga | H05K 3/0052 174/251 |
| 2009/0147440 | A1 * | 6/2009 | Cygan | H01G 4/232 361/306.3 |
| 2009/0286706 | A1 * | 11/2009 | Chakrabarty | C11D 3/1213 510/131 |
| 2010/0124848 | A1 * | 5/2010 | Atkinson | H01R 13/719 439/620.09 |
| 2011/0089408 | A1 | 4/2011 | Schmid | |
| 2011/0292567 | A1 | 12/2011 | McConnell | |
| 2011/0293998 | A1 | 12/2011 | Sato | |
| 2011/0294312 | A1 * | 12/2011 | Costello | H01R 12/79 439/77 |
| 2013/0107419 | A1 | 5/2013 | Hill | |
| 2013/0146347 | A1 | 6/2013 | McConnell et al. | |
| 2014/0160624 | A1 | 6/2014 | McConnell et al. | |
| 2014/0204503 | A1 * | 7/2014 | Ortner | H01C 1/01 361/301.4 |
| 2015/0282325 | A1 * | 10/2015 | Fujii | H05K 1/0268 361/767 |
| 2017/0048982 | A1 * | 2/2017 | Ishihara | H05K 1/111 |
| 2017/0258402 | A1 | 9/2017 | Acquista et al. | |

FOREIGN PATENT DOCUMENTS

| | | |
|---|---|---|
| CN | 102263214 A | 11/2011 |
| CN | 102906836 A | 1/2013 |
| CN | 103069518 A | 4/2013 |
| CN | 103999176 A | 8/2014 |
| DE | 19928190 A1 | 1/2001 |
| DE | 102013109093 | 2/2014 |
| DE | 102013108753 A1 | 2/2015 |
| EP | 0929087 | 7/1999 |
| EP | 2587502 A2 | 5/2013 |
| JP | S55-138221 A | 10/1980 |
| JP | S56-027912 A | 3/1981 |
| JP | S58-168214 A | 10/1983 |
| JP | S58-175625 U | 11/1983 |
| JP | S60-137010 A | 7/1985 |
| JP | S60-119739 A | 8/1985 |
| JP | S62-169317 A | 7/1987 |
| JP | H02-45620 U | 3/1990 |
| JP | H02-161711 A | 6/1990 |
| JP | H06-104031 | 4/1992 |
| JP | H04-059124 A | 5/1992 |
| JP | H04-364708 A | 12/1992 |
| JP | H05-85060 A | 4/1993 |
| JP | H05-043618 U | 6/1993 |
| JP | H05-243075 A | 9/1993 |
| JP | H07-235357 A | 9/1995 |
| JP | H11-74147 A | 3/1999 |
| JP | H11-186100 A | 7/1999 |
| JP | H11-214260 A | 8/1999 |
| JP | 2000-003829 A | 1/2000 |
| JP | 2000-021675 A | 1/2000 |

(56) References Cited

FOREIGN PATENT DOCUMENTS

| | | | | |
|---|---|---|---|---|
| JP | 2000-49042 A | 2/2000 | | |
| JP | 2000-182887 A | 6/2000 | | |
| JP | 2000-200731 A | 7/2000 | | |
| JP | 2000-223358 A | 8/2000 | | |
| JP | 2000-235932 A | 8/2000 | | |
| JP | 2002-008741 A | 1/2002 | | |
| JP | 2002057063 A | 2/2002 | | |
| JP | 2002-217058 A | 8/2002 | | |
| JP | 2002313667 A | 10/2002 | | |
| JP | 2006-24825 A | 1/2006 | | |
| JP | 2006073706 A * | 3/2006 | ............ | Y02E 10/50 |
| JP | WO 2006/022257 A1 | 3/2006 | | |
| JP | 2006-148033 A | 6/2006 | | |
| JP | 2008-130954 A | 6/2008 | | |
| JP | 2010-123614 A | 6/2010 | | |
| JP | 2010-161172 A | 7/2010 | | |
| JP | 2010161172 A * | 7/2010 | ............ | H01G 4/30 |
| JP | 2011040684 A * | 2/2011 | ............ | H01G 4/252 |
| JP | 2012-023322 A | 2/2012 | | |
| JP | 2012-522382 A | 9/2012 | | |
| JP | 2014-042081 A | 3/2014 | | |
| JP | 2014-179456 A | 9/2014 | | |
| KR | 2009-0125715 A | 12/2009 | | |
| KR | 102010010680 A | 2/2010 | | |
| KR | 2010-0066080 A | 6/2010 | | |
| KR | 2013-0089678 A | 8/2013 | | |
| WO | WO-2006022257 A1 * | 3/2006 | ............ | H01G 2/065 |
| WO | 2010/111575 A2 | 9/2010 | | |

OTHER PUBLICATIONS

TDK: "Multilayer Ceramic Chip Capacitor," downloaded at http://product.tdk.com/en/techjournal/archives/vol06)mlcc/contents06.html, Nov. 3, 2015 (2 pages).

Li, H. et al., International Frontiers of Materials Science and Engineering, Feb. 28, 2003, Shandong Science and Technology Press, p. 129 (1 page).

Wu, Z., et al., Surface Assembly Technology Base, Jan. 31, 2002, National Defense Industry Press, p. 132 (1 page).

Patent Office of the People's Republic of China, Search Report in Chinese Patent Application No. 201580076969.X, dated Aug. 15, 2018 (9 pages, English translation only).

AVX: Vertical, http://www.avx.com/products/ceramic-capacitors/stacked/vertical/, Accessed prior to Aug. 24, 2017, 4 pages.

AVX: Vertical—RoHS Compliant TurboCap, http://www.avx.com/products/ceramic-capacitors/stacked/rohs-compliant-turbocap/, Accessed prior to Aug. 24, 2017, 4 pages.

AVX: Vertical—TurboCap, http://www.avx.com/products/ceramic-capacitors/stacked/turbocap/, Accessed prior to Aug. 24, 2017, 4 pages.

Seki, A. et al: "MLCCs Brace up for Strength Requirement of Automotives", http://www.murata.com/~/media/webrenewal/about/newsroom/tech/capacitor/mlcc/ta13aa.ashx?la=zh-cn, Technology Focus, AEI Dec. 2013, p. 26-28.

TDK: "Film Capacitors—Metallized Polypropylene Film Capacitors (MKP)", http://en.tdk.eu.inf/20/20/db/fc_2009/MKP_B32674_678.pdf, Jun. 2015, 40 pages.

TDK: "Film Capacitors—Power Electronic Capacitors—MKPDC", http://en.tdk.eu/inf/20/50/ds/B2562_.pdf, May 2015, 21 pages.

TDK: "Film capacitors—Power electronic capacitors—PCC Series", http://en.tdk.eu/inf/20/50/ds/B25655A1148000.pdf, Jul. 2008, 5 pages.

TDK: "Multilayer Ceramic Chip Capacitors", https://product.tdk.com/info/en/catalog/datasheets/mlcc_automotive_soft_en.pdf, Nov. 2015, 14 pages.

TDK: "Multilayer Ceramic Chip Capacitors", https://product.tdk.com/info/en/catalog/datasheets/mlcc_automotive_megacap_en.pdf, Oct. 2015, 10 pages.

* cited by examiner

ELECTRICAL COMPONENT AND A METHOD FOR PRODUCING AN ELECTRICAL COMPONENT

CROSS-REFERENCE TO RELATED APPLICATIONS

This application is a U.S. National Stage of International Application No. PCT/EP2015/080853, filed Dec. 21, 2015, which claims the benefit of Germany Patent Application No. 102015102866.2, filed on Feb. 27, 2015, both of which are incorporated herein by reference in their entireties.

The invention specifies an electrical component. The said electrical component is, in particular, a ceramic component. The component is, for example, in the form of a capacitor. The invention further specifies a method for producing an electrical component.

In the case of an electrical component as a commodity product, different requirements are made in respect of the size and the construction and connecting technique, depending on the area of installation. This often leads to necessary adjustments to the product and requires the production of special types of a design.

By way of example, surface-mountable ceramic chips with metallized caps, as are described in document EP 0 929 087 A2 for example, are known. In these components, leadframes are used for improving the mechanical stability. Other capacitors are equipped with soldered pins for example. However, the components are each secured at their backend (connecting technique). For a specific type of capacitor, the backend is often defined by the use temperature range and the mechanical strength.

One object of the present invention is to specify an electrical component having improved properties.

A first aspect of the present invention specifies an electrical component having a plurality of partial bodies. The component has a base on which the partial bodies are arranged. In addition, the component has at least one connection contact for electrically connecting the partial bodies to a carrier.

The component is, for example, a capacitor, in particular a power capacitor. The partial bodies are preferably ceramic bodies. The partial bodies preferably each have a multilayer structure. By way of example, the partial bodies each have ceramic layers and electrode layers which are arranged one above the other. The layers of a partial body are preferably sintered together.

The partial bodies are arranged, for example, next to one another on the base. The partial bodies all preferably have the same dimensions. The partial bodies preferably do not form a monolithic sintered body. By way of example, the partial bodies are each provided in sintered form and then arranged next to one another during production of the component. In one embodiment, the partial bodies are not fastened to one another. Adjacent partial bodies can be arranged at a distance from one another. The partial bodies as a whole are also called the main body of the component.

The component is preferably in the form of a module in such a way that the number of partial bodies can be selected depending on the desired properties of the component, without complicated reconstruction of the component being necessary. Furthermore, the construction of the main body from separate partial bodies allows for compensation of manufacturing tolerances. In addition, a build-up of mechanical stresses in the component can be prevented, in particular when using a piezoelectric material.

The base preferably comprises a non-conductive material, for example a plastic material. The base serves to ensure sufficient mechanical stability of the component. The base is preferably of integral design.

In one embodiment, the partial bodies are not fastened to the base. This allows a particularly great deal of flexibility when producing the component. However, the partial bodies can also be fastened to the base, for example adhesively bonded onto the base, in order to increase the mechanical stability.

The connection contact preferably serves to supply electrical voltage and electrical signals to the component. A parallel electrical interconnection of the partial bodies is preferably produced by the connection contact. The carrier preferably has at least one electrical contact to which the connection contact is electrically connected. The carrier is, in particular, in the form of a printed circuit board. Furthermore, the connection contact can also serve to establish mechanical fastening and thermal connection to the carrier.

The connection contact is formed, for example, from a metal sheet. In this case, a planar piece with the dimensions of the connection contact is first formed, for example by stamping, from a planar metal sheet for example. The connection contact is then preferably bent. By way of example, the connection contact has an angled shape. The connection contact may also be a leadframe.

In one embodiment, the connection contact is guided through the base. This allows a particularly stable connection of the connection contact to the base. As an alternative, the connection contact can also be guided around the base.

By way of example, the component has two connection contacts. The connection contacts are preferably arranged on opposite sides of the partial bodies. The properties described with respect to one connection contact preferably correspondingly apply to the other connection contact. The base is preferably connected to both connection contacts.

The partial bodies are preferably clamped between two connection contacts. By way of example, the connection contacts are of resilient design, so that, during assembly of the component, the connection contacts are pushed apart and the partial bodies are then arranged between the connection contacts. As an alternative or in addition to this, the base can be of resilient design.

The connection contact preferably has at least one contact region for fastening the connection contact to the main body, in particular to the partial bodies, of the component. Furthermore, the connection contact preferably has at least one connection region for fastening to the carrier. By way of example, the connection region is located on one side, in particular a top side, of the base and the contact region is located on the opposite side, in particular a bottom side, of the base.

In one embodiment, the partial bodies are fastened to the connection contact by a contact means, in addition to or as an alternative to clamping. The contact means used may be, for example, a soldering or sintering material. The partial bodies each have, for example, an external contact to which the connection contact is fastened. The external contact is, for example, in the form of a metal layer, in particular in the form of a sputtered metal layer.

The connection contact, in particular in its contact region, preferably has a plurality of partial contacts, wherein each partial contact makes contact with one of the partial bodies. The partial contacts are, for example, in the form of contact fingers. The partial contacts are preferably connected to one another in a connecting region. The connecting region is located, for example, only in the vicinity of the base and/or within the base.

Owing to partial contacts being designed in this way, it is preferably possible to separate the component, so that contact is further made with each partial body by a partial contact when the component is severed along a plane between two partial bodies. Mechanical flexibility of the connection contact can be achieved owing to the connecting region being present only in the vicinity of the base. This allows simple assembly of the component and also compensation of mechanical stresses.

By way of example, the connection contact is designed for SMD, that is to say surface, mounting. As an alternative, the connection contact can also be designed for pin mounting. By way of example, the pin mounting can be performed by soldering or by insertion by pressing. The manner of mounting the connection contact can preferably be selected in a flexible manner, without the shape or the design of the component having to be changed.

The connection contact, in particular in its connection region, preferably has a plurality of partial connections for electrical connection to the carrier. The partial connections are designed, for example, in the form of tabs or pins, depending on the desired manner of mounting. The partial connections are connected to one another, for example, only in a connecting region in the vicinity of or within the base.

Owing to a design of partial connections in this way, it is preferably possible to separate the component, so that contact is further made with each partial body by a partial contact when the component is severed along a plane between two partial bodies. In addition, the partial connections ensure a high current-carrying capacity.

In one embodiment, the connection contact has at least one partial connection and at least one partial contact for each partial body. By way of example, the partial connection is located directly beneath the respective partial contact.

The electrical component is preferably designed in such a way that it can be separated into smaller components by a cut along a plane between two of the partial bodies, wherein each of the smaller components has at least one partial body which is arranged on a base and is connected to a connection contact. Each of the smaller components can have the above-described properties of the component. Production of components in the form of a variable "endless" design is possible in this way.

The connection contact comprises, for example, a material composite. In this case, the materials are arranged one above another in the form of layers, for example. In one embodiment, the connection contact comprises a first material and a second material which is arranged on said first material. The first material is preferably in the form of a first layer and the second material in the form of a second layer.

The first material has, for example, a high electrical conductivity. A high electrical conductivity is, for example, at least 40 m/($\Omega \cdot$mm$^2$), preferably at least 50 m/($\Omega \cdot$mm$^2$). The first material preferably also has a high thermal conductivity. A high thermal conductivity is, for example, at least 250 W/(m$\cdot$K), preferably at least 350 W/(m$\cdot$K).

The second material preferably has particularly good mechanical and thermomechanical properties. In particular, the second material has a low coefficient of thermal expansion. A low coefficient of thermal expansion is, for example, at most 5 ppm/K, preferably at most 2.5 ppm/K. The coefficient of expansion is preferably as close as possible to the coefficient of expansion of the ceramic. Good thermal matching to the ceramic can be achieved in this way. As a result, a build-up of stress during temperature changes can be avoided for the most part and formation of cracks in the component can largely be prevented.

In a preferred embodiment, the first material comprises copper or consists of copper. Copper has a particularly good electrical and thermal conductivity.

By way of example, the second material comprises an iron-containing alloy. The second material preferably comprises Invar or consists of Invar. Invar is an iron-nickel alloy comprising approximately ⅓ nickel and ⅔ iron. This material has a particularly low coefficient of thermal expansion. In particular, the coefficient of thermal expansion is close to the coefficient of expansion of the ceramic. On account of the combination with the first material, sufficient conductivity for the connection contact can also be ensured even when the second material has a low electrical conductivity.

In a preferred embodiment, the first material comprises copper or consists of copper. By way of example, the second material comprises an iron-containing alloy. The second material preferably comprises Invar or consists of Invar. Invar is an iron-nickel alloy comprising approximately ⅓ nickel and ⅔ iron.

In one embodiment, the connection contact additionally comprises a third material. The third material is arranged on the second material, so that the second material is arranged between the first material and the third material. The third material is preferably in the form of a third layer. The third material is preferably identical to the first material. The third layer preferably has the same thickness as the first layer. Warpage of the connection contact in the event of a change in temperature can preferably be prevented owing to the design of the third material.

In particular, the connection contact can comprise a material composite which is composed of copper-Invar-copper. A composite of this kind can also be referred to as a CIC composite.

During the production of the connection contact, a metal sheet comprising the second material is provided for example. The first material is then applied, for example rolled, onto the second material. Afterward, the the third material can be applied, in particular rolled, onto the opposite side of the metal sheet.

The connection contact can also have a different design to that described above or can be produced in some other way. By way of example, the connection contact comprises only one material, for example only copper. The connection contact can also have a plurality of materials, for example a material composite, wherein the material composite does not have the property according to which the first material has a high electrical conductivity and the second material has a low coefficient of thermal expansion. By way of example, the connection contact comprises copper and is coated with silver.

A further aspect of the present invention specifies an electrical component having only one single partial body. The electrical component can otherwise have all of the properties of the component described above.

A further aspect of the present invention specifies a component arrangement having a component and a carrier to which the component is fastened. The component is preferably designed like the component described above. The carrier is preferably designed, as described above, for electrical connection of the component.

The connection contact is connected to the carrier, for example, by SMD or pin mounting. The connection contact can be connected to the carrier by a connecting material. The connecting material is, for example, a soldering or sintering material. Furthermore, the connection contact can also be connected to the carrier by insertion by pressing.

A further aspect of the present invention specifies a method for producing a component and or/a component arrangement. The component or the component arrangement is designed, for example, as described above. The component or the component arrangement can also have only one partial body which is arranged on the base, wherein the connection contact is designed for electrically connecting the partial body. Therefore, the method is suitable for producing a component or a component arrangement with one or more partial bodies and the further properties described above.

According to the method, the connection contact is provided and connected to a base in a later step. Two connection contacts can also be provided and connected to the base. In a further later step, the connection contact is separated together with the base. The connection contact preferably has the above-described partial contacts and/or partial connections. The separation is performed, in particular, in a plane between two adjacent partial contacts or partial connections. During the separation, both the base and the connection contact are divided. The size of the component can be flexibly adjusted in this way.

In one embodiment of the method, the partial bodies are provided and arranged on the base. The arrangement of the partial bodies on the base can be performed before or after the separating step. By way of example, the base together with the connection contact is first brought to a desired size by separation. Afterward, the partial bodies are arranged on the separated part of the base. As an alternative, the partial bodies are first arranged on the base and the arrangement comprising partial bodies, base and connection contact is separated into smaller components afterward.

The arrangement of the at least one partial body is performed, for example, by clamping. To this end, two connection contacts are provided and connected to a base. By way of example, the connection contacts, in particular contact regions of the connection contacts, are bent outward. The partial body is arranged between the connection contacts. The connection contacts are preferably of resilient design, so that the connection contacts spring back after being released and clamp the partial body. As an alternative or in addition to this, the base can be bent in order to arrange the partial bodies between the connection contacts in a clamping manner.

Additional fastening of the one or more partial bodies to the connection contacts is performed, for example, by soldering or sintering. In particular, a contact material, for example a soldering or sintering material, can already be applied to the partial bodies and/or to the connection contact before the partial body is arranged between the connection contacts.

Several aspects of an invention are described in the present disclosure. All of the properties which are disclosed with respect to the component, the component arrangement and/or the method are also correspondingly disclosed with respect to the respective other aspects, even if the respective property is not explicitly mentioned in the context of the other aspects.

The subjects described here are explained in greater detail below on the basis of schematic exemplary embodiments.

In the figures:

In the following figures, identical reference symbols preferably refer to functionally or structurally corresponding parts of the various embodiments.

Figure 1:
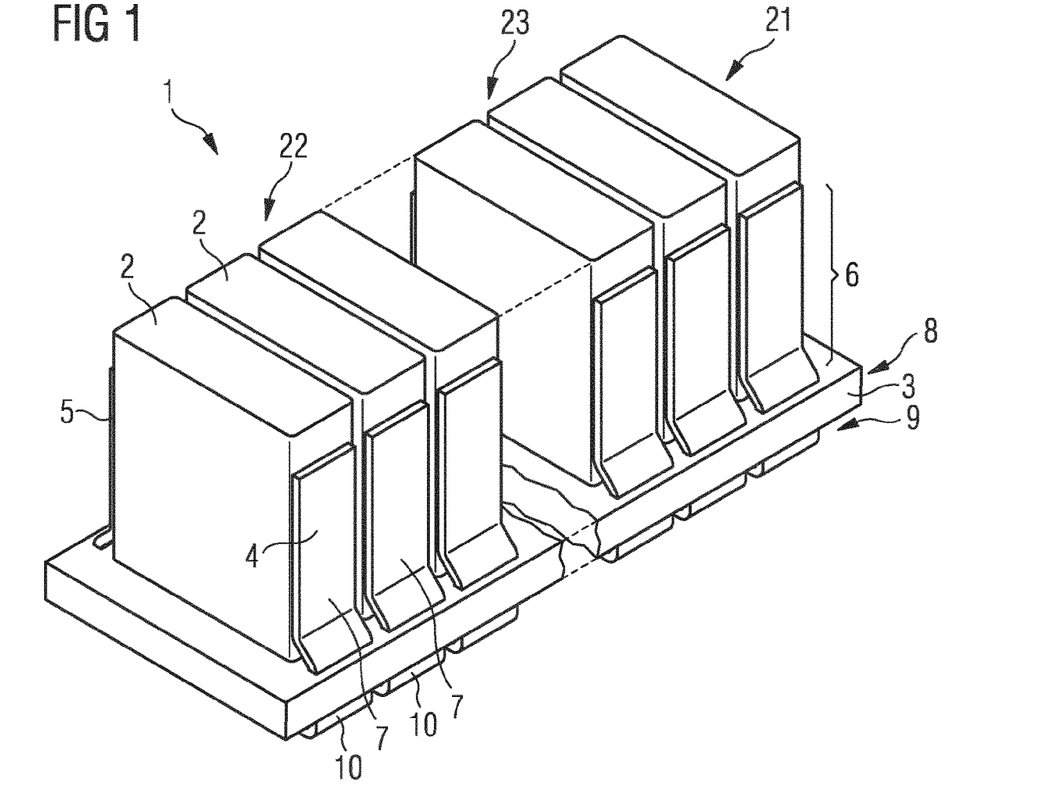
FIG. 1 shows a perspective view of a schematic illustration of a component.

FIG. 1 shows a conceptual view of an electrical component 1. The component 1 has a variable length, this being indicated by the illustration being interrupted and illustrated using dashed lines in the middle.

By way of example, the component 1 is in the form of a capacitor, in particular in the form of a ceramic capacitor. By way of example, the component 1 is in the form of a power capacitor.

The component 1 has a plurality of partial bodies 2. The partial bodies 2 are arranged next to one another. All of the partial bodies 2 preferably have the same dimensions. The number of partial bodies 2 in the component 1 can vary depending on the desired properties of the component 1. The partial bodies 2 are in the form of chips for example.

The partial bodies 2 do not form a monolithic sintered body. By way of example, the partial bodies 2 are arranged at a distance from one another. By way of example, there is a gap between adjacent partial bodies 2. On account of the required capacitance density and miniaturization of the component 1, the gap is preferably small. The partial bodies 2 can also be fastened to one another, for example connected to one another by means of an elastic material.

The partial bodies 2 as a whole can also be called the main body 21 of the component 1. The main body 21 has a cuboidal shape. By way of example, the component 1 has between one and ten partial bodies 2, but larger combinations are also possible.

The partial bodies 2 each preferably comprise a ceramic material. By way of example, the partial bodies 2 each have a multilayer structure. All of the layers of a partial body 2 are preferably sintered together. In particular, the partial bodies 2 each have a layer stack comprising ceramic layers and electrode layers which are arranged between said ceramic layers. By way of example, the electrode layers comprise copper. The main planes of the layers of the partial bodies 2 preferably run parallel to the largest side face of the respective partial body 2. The direction in which the partial bodies 2 are arranged next to one another preferably also corresponds to the stacking direction of the layers in the partial bodies 2.

The component 1 has a base 3 on which the partial bodies 2 are arranged. The base 3 is in the form of a plate. In particular, the base 3 has a base area which is at least as large as the base area of the main body 21. The base 3 preferably comprises a non-conductive material, for example a plastic material.

The component 1 has at least one connection contact 4 for electrical connection of the component 1. In particular, the component 1 has two connection contacts 4, 5 which are arranged, for example, on opposite sides of the partial bodies 2. By way of example, the connection contacts 4, 5 each extend completely over two longitudinal sides of the main body 21. The partial bodies 2 are interconnected electrically in parallel by the connection contacts 4, 5.

Figure 5:
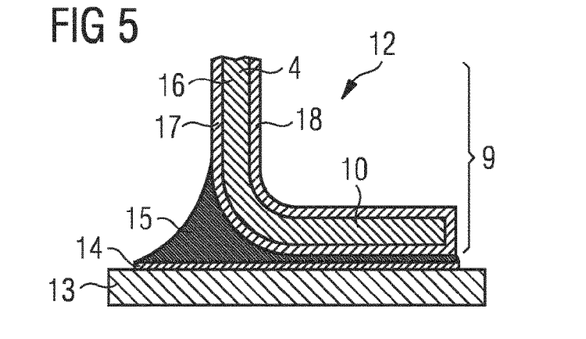
FIG. 5 shows a sectional view of a connection of a component to a carrier according to one embodiment.

The connection contacts 4, 5 are designed to connect the component 1 to a carrier (see FIG. 5 for example). In particular, the connection contacts 4, 5 are designed to electrically connect the component 1. Furthermore, the connection contacts 4, 5 can also serve to mechanically fasten the component 1 to the carrier. The connection contacts 4, 5 can also ensure thermal connection to the carrier.

The carrier is preferably a printed circuit board. By way of example, the printed circuit board is in the form of an FR4 circuit board. It may also be a ceramic substrate. By way of example, the carrier is in the form of a DCB (direct copper bonded) substrate in the case of which copper is applied to a ceramic.

The connection contacts 4, 5 are each preferably formed from a metal sheet. In particular, the connection contacts 4, 5 may be a connection bracket or leadframe. The connection contacts 4, 5 comprise, for example, copper and/or a multilayer metal composite.

The connection contacts 4, 5 are connected to the base 3. By way of example, the connection contacts 4, 5 are guided through the base 3. By way of example, the base 3 is produced using an injection-molding process. The connection contacts 4, 5 are, for example, encapsulated with the material of the base 3 by injection. The base 3 can also be produced separately from the connection contacts 4, 5 and have incisions through which the connection contacts 4, 5 are inserted into the base 3. As an alternative, the connection contacts 4, 5 can also be guided around the base 3, for example around a narrow side of the base 3.

The connection contacts 4, 5 are preferably not electrically interconnected to the base 3. The base 3 preferably does not have any electrical contacts for connection of the connection contacts 4, 5. The base 3 can contribute to the mechanical stabilization of the connection contacts 4, 5.

Only one connection contact 4 is described in detail in the text which follows, wherein the other connection contact 5 can be of corresponding design.

The connection contact 4 has a contact region 6 for making contact with the partial bodies 2. The connection contact 4 has, in the contact region 6, a plurality of partial contacts 7, wherein each partial contact 7 preferably makes contact with precisely one of the partial bodies 2. By way of example, the partial contacts 7 each rest against one of the partial bodies 2. The partial contacts 7 are preferably each fastened to one of the partial bodies 2. The partial contacts 7 are, for example, in the form of contact arms or contact fingers. By way of example, each partial contact 7 can also have two or more contact arms or contact fingers. A gap which separates the partial contacts 7 from one another extends between the partial contacts 7 in each case.

The partial contacts 7 are connected to one another, for example, in a connecting region 8 of the connection contact 4. The connecting region 8 preferably lies only in the vicinity of or within the base 3. By way of example, the connecting region 8 can lie entirely in the interior of the base 3, as is shown in FIG. 1 for example.

Relief of mechanical loading on the component 1 is firstly possible owing to the presence of the partial contacts 7. In particular, the partial contacts 7 can also have a certain degree of flexibility in the stacking direction of the partial bodies 2. Furthermore, a refinement of this kind can also be advantageous in respect of the current-carrying capacity and the heat-dissipation capacity of the component 1.

By way of example, partial bodies 2 are arranged between the connection contacts 4, 5 in a clamping manner. The partial bodies 2 are preferably fastened to the connection contacts 4, 5 by a contact material, in addition to the clamping arrangement. By way of example, the connection contacts 4, 5 are fastened to the partial bodies 2 by means of a sintering material.

The partial contacts 7 are each fastened, for example, to an external contact of the partial bodies 2. In particular, each of the partial bodies 2 has an external contact. The external contact has, for example, one or more sputtered layers. In one embodiment, said layers have a Cr/Ni/Ag layer structure.

The connection contact 4 has a connection region 9 for electrical and/or mechanical connection to the carrier. The connection region 9 preferably has a plurality of partial connections 10 for mechanical and/or electrical connection to the carrier. This allows stable fastening to the carrier, even in the case of a relatively large design of the component 1.

The connection contact 4 preferably has at least one partial connection 10 for each of the partial bodies 2 in each case. The partial connections 10 each constitute, for example, an extension of the partial contacts 7 in the direction of the carrier. The partial connections 10 can likewise be designed in the form of arms or fingers. By way of example, the partial connections 10 are likewise connected to one another only in the connecting region 8 of the connection contact 4.

The various parts of the connection contact 4 are preferably connected to one another in such a way that the connection contact 4 is of integral design.

The connection region 9 and, in particular, the partial connections 10 can be configured in accordance with a desired connection concept. By way of example, the partial connections 10 are designed for SMD mounting, for mounting by soldering or for mounting by insertion by pressing. Various refinements of the connection region 9 are shown in the following figures.

The design of the component 1 shown allows production in the form of a variable "endless" design. By way of example, the component 1 shown can be formed by separation from a larger component. By way of example, the component 1 shown can also further be separated into smaller components 22, 23, this being indicated by the illustration being interrupted and illustrated using dashed lines in the middle.

The ability to separate is ensured, in particular, by the presence of the individual partial bodies 2 and by the form of the connection contacts 4, 5. Therefore, the partial contacts 7 and partial connections 10 allow separation of the connection contact 4 in such a way that, after a cut along a plane between two adjacent partial bodies 2, each partial body 2 still has a partial contact 7 and a partial connection 10. In this way, contact can still be made with each partial body 2 even after separation, without reconfiguration of the connection contacts 4, 5 being required. By way of example, the connection contact 4 can be separated by breaking the connection pieces of the partial contacts 7 or partial connections 10, for example webs, in two.

With this structural concept, various voltage classes and capacitance sizes can be presented using a large number of contact-making techniques. The voltage class of a partial body 2 is defined by the exact stacking sequence of the layers in the inner structure of the partial body 2. Since the partial bodies 2 all have the same external geometry, they can be interchanged in the component 1 as desired. By mixing partial bodies 2 having a different capacitance profile by means of bias, said capacitance profile can be varied and adapted within certain limits. The total capacitance of the component 1 is defined by the installed partial bodies 2. This opens up new degrees of freedom in respect of optimizing installation space, power density and efficiency for the design process at the module level.

Figure 2A:
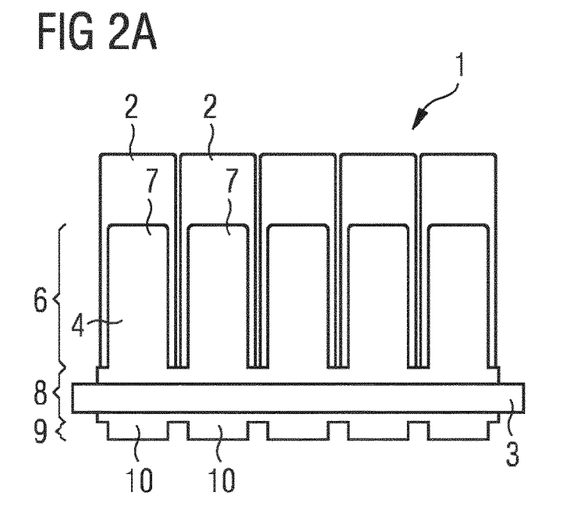
FIGS. 2A and 2B show side views of one embodiment of a component.
Figure 2B:
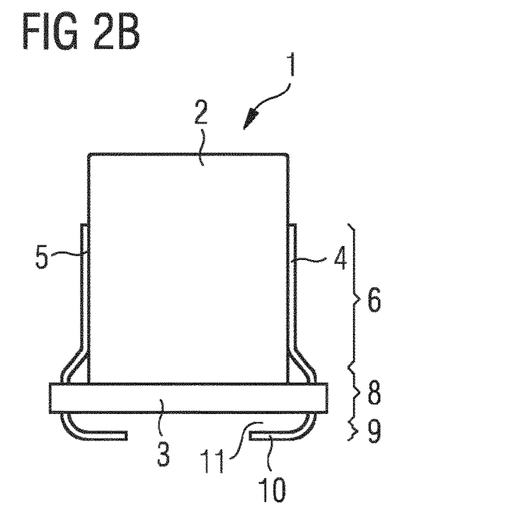

FIGS. 2A and 2B show side views of one embodiment of a component 1. FIG. 2A shows a plan view of a side face of the connection contact 4, and FIG. 2B shows a plan view of one of the partial bodies 2 rotated through 90° in relation to said plan view. The component 1 is designed in a similar way to the component 1 from FIG. 1.

As shown in FIG. 2A, the partial contacts 7 extend upward from the base 3 in the form of contact arms. The partial contacts 7 are formed parallel in relation to one another. The partial contacts 7 are connected to one another in the region of the base 3. In contrast to FIG. 1, the connecting region 8 also extends slightly above and, respectively, below the base 3. Apart from in the connecting region 8, the partial contacts 7 are not further connected to one another. As shown in FIG. 1, the partial contacts 7 can also be connected to one another only within the base 3 or else not be connected to one another. Analogously, the partial connections 10 are also connected to one another in the connecting region 8.

As shown in FIG. 2B, the connection contacts 4, 5 are designed, for example, for SMD contact-connection. To this end, the region of the connection contacts 4, 5 on that side of the base 3 which is averted from the partial bodies 2 is bent inward. In particular, the partial connections 10 are bent inward. The partial connections 10 are arranged, for example, entirely below the base 3. As an alternative, the partial connections 10 can also be bent outward and protrude out of a basic shape of the base 3.

By way of example, the connection contacts 4, 5 are connected to a carrier by soldering. All of the components and materials involved preferably have a high degree of temperature stability, so that a sintered connection is also possible for example.

The connection contacts 4, 5 are preferably formed in such a way that the base 3 is arranged at a distance from the carrier. In particular, there is an air gap 11 between the base 3 and the connection region 9.

Figure 3A:
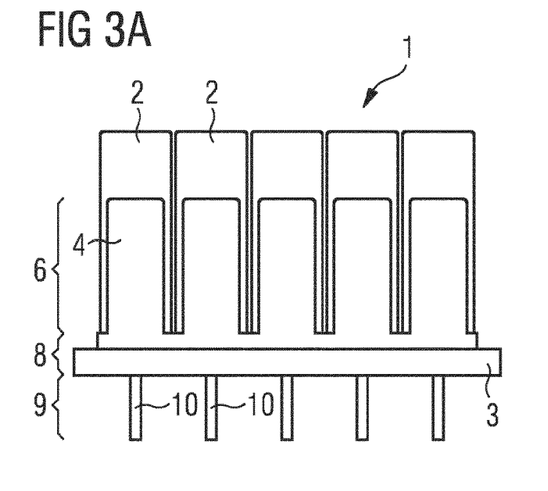
FIGS. 3A and 3B show side views of a further embodiment of a component.
Figure 3B:
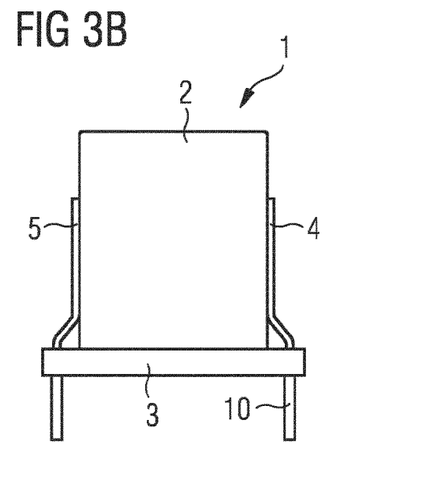

FIGS. 3A and 3B show side plan views of a further embodiment of a component 1. In contrast to the component 1 shown in FIGS. 2A and 2B, the connection contacts 4, 5 have pins for connection to a carrier. In particular, the partial connections 10 are each in the form of pins. The partial connections 10 can be, in particular, in the form of soldering pins.

In the present case, the partial connections 10 are not connected to one another below the base 3. By way of example, the partial connections 10 are connected to one another within the base 3. In particular, the connection contact 4 can be of integral design.

Figure 4A:
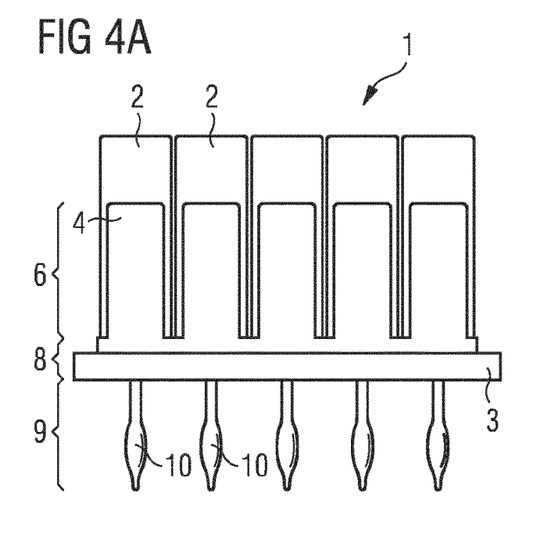
FIGS. 4A and 4B show side views of a further embodiment of a component.
Figure 4B:
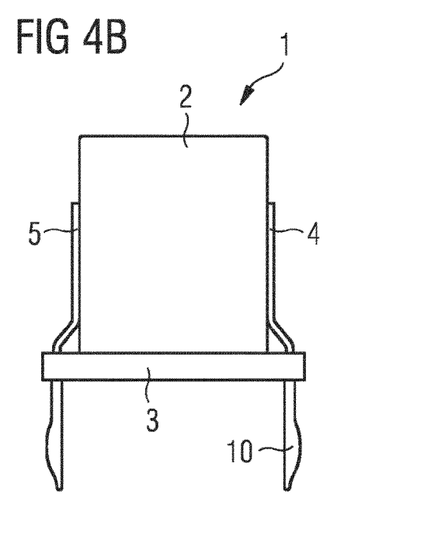

FIGS. 4A and 4B show side plan views of a further embodiment of a component 1. In contrast to the component 1 shown in FIGS. 3A and 3B, the connection contacts 4, 5 have press-in pins for connection to a carrier. In particular, each of the partial connections 10 is in the form of a press-in pin. In this case, each partial connection 10 has a thickened portion in order to ensure stable fastening to a carrier.

FIG. 5 shows a detail of a component arrangement 12, in which a component 1 is fastened to a carrier 13. In particular, a connection of the connection region 9 to the carrier 13 is shown here. The component 1 is designed, for example, as in the preceding figures. In particular, the connection regions 9 can be designed, as shown in FIGS. 2A and 2B, for SMD contact-connection.

The carrier 13 is, in particular, in the form of a circuit board. It is, for example, an FR4 or ceramic substrate. The carrier 13 has at least one contact point 14 to which the connection region 9 of the connection contact 4 is fastened. The carrier 13 with the contact point 14 is, for example, in the form of a printed circuit board with contact pads or in the form of a ceramic substrate with contact areas, in particular in the form of a DCB substrate. The contact point 14 is, for example, a soldering pad, a Cu contact or an Ni-Au contact.

By way of example, the connection region 9 is soldered or sintered to the contact point 14. To this end, a connecting material 15 in the form of a soldering or sintering material is provided for example. The soldering material used is, for example, an SAC solder. The sintering material used is, for example, silver or copper.

The connection contact 4 has, for example in addition to a high thermal and electrical conductivity, a coefficient of thermal expansion which is as low as possible. These different properties are ensured, for example, by a material composite, in particular by a multilayer structure of the connection contact 4.

The connection contact 4 comprises, for example, a base material 16. One or more further layers 17, 18 can be applied onto the base material 16. By way of example, the base material comprises copper or consists of copper. The base material 16 can also comprise a plurality of different materials which are arranged one on the other.

By way of example, the connection contact has a CIC (copper-Invar-copper) structure with electroplating layers which are applied on both sides.

The further layers 17, 18 form, for example, the outer sides of the connection contact 4. They are, for example, electroplating layers, in particular nickel or silver layers.

The connection contact 4 of the component 1 according to the invention can have the material structure described above. The connection contact 4 can also have a different material structure. Furthermore, the connection contact 4 can be fastened to a carrier 13 as described above. However, the connection contact 4 can also be fastened to a carrier 13 in some other way.

Figure 6A:
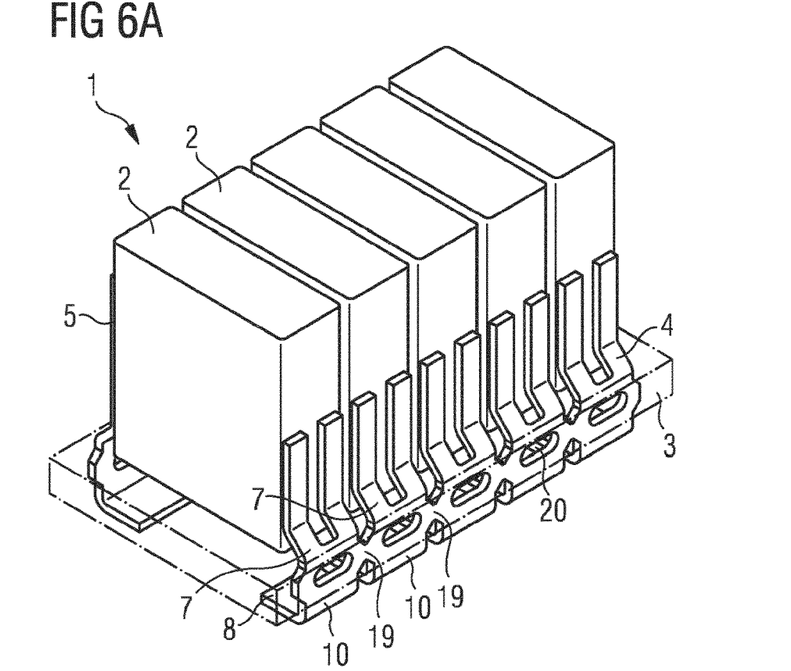
FIGS. 6A and 6B show perspective views of a further embodiment of a component.
Figure 6B:
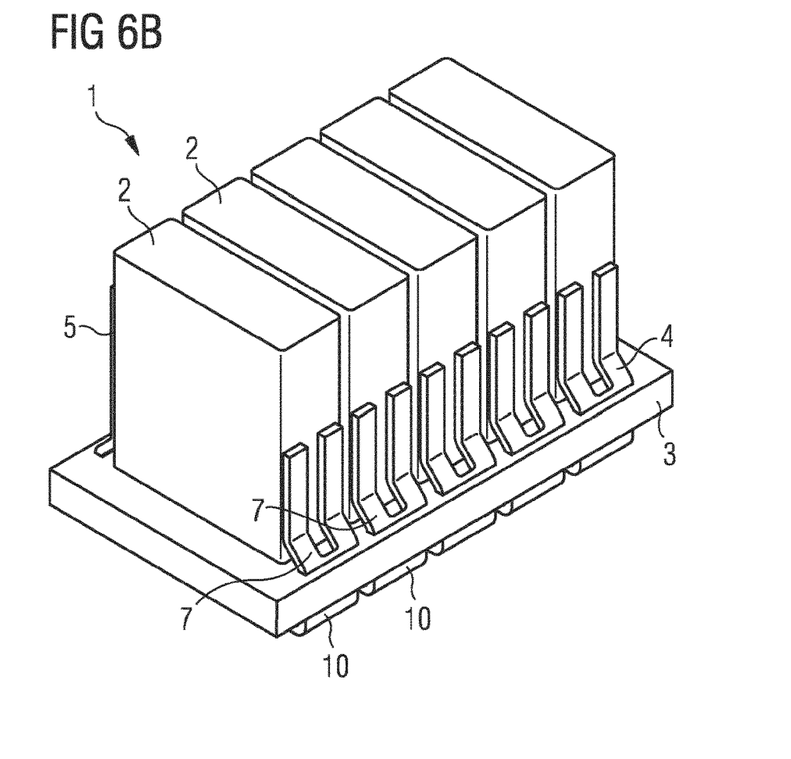

FIGS. 6A and 6B show perspective views of a further embodiment of a component 1. In FIG. 6A, the base 3 is indicated in a transparent manner by dashed edges.

In contrast to the component 1 shown in FIGS. 2A and 2B, the partial contacts 7 each have two arms. The two arms rest against one of the partial bodies 2. The partial connections 10 are designed, for example, as in FIGS. 2A and 2b.

As shown in FIG. 6A, the connection contact 4 is of integral design. The connecting region 8 between the partial contacts 7 and, respectively, the partial connections 10 is arranged in the interior of the base 3. The partial contacts 7 and, respectively, the partial connections 10 are connected to one another by webs 19. The component 1 can be separated by breaking the webs 19 into two.

Furthermore, the connection contact 4 has cutouts 20 within the base 3. The cutouts 20 serve, for example, to improve the fastening of the connection contact 4 to the base 3.

Figure 7:
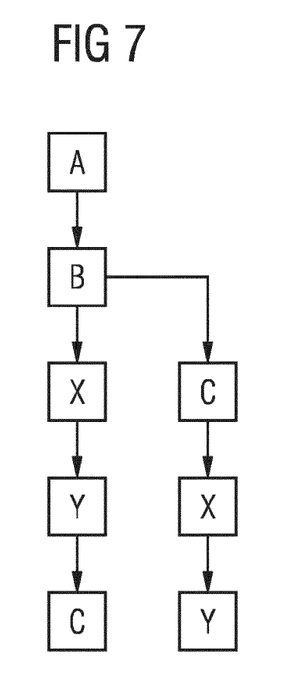
FIG. 7 shows a flowchart of method steps for producing a component.

Two methods for producing a component 1 are explained in the text which follows with reference to the flowchart shown in FIG. 7. The component 1 is designed, for example, as in FIGS. 1 to 6B. The component 1 can also have only one partial body 2, instead of a plurality of partial bodies 2.

A connection contact 4 is provided in a step A. The connection contact 4 is designed, for example, as in the preceding figures. In particular, the connection contact 4 is in the form of a metal sheet, for example in the form of a leadframe. The connection contact 4 is preferably of integral design. Two connection contacts 4, 5 of this kind are preferably provided.

In a step B, the one or more connection contacts 4, 5 are connected to a base 3. The base 3 is designed, for example, as in the preceding figures. By way of example, the base 3 comprises a plastic material. The connection contacts 4, 5 are inserted, for example, into an injection mold and encapsulated with the material of the base 3 by injection. In this, said connection contacts are embedded in the base 3 at the same time as the base 3 is produced.

As an alternative, the base 3 can also have incisions through which one or more connection contacts 4, 5 are guided. In this case, the base 3 is first provided and then connected to the connection contacts 4, 5. The connection contacts 4, 5 can also be guided around through the base 3. By way of example, the connection contacts 4, 5 can be clamped onto the base 3.

In a step X, one or more partial bodies 2 are provided. The partial bodies 2 are designed, for example, as in the preceding figures.

The partial bodies 2 are arranged on the base 3. By way of example, the partial bodies 2 are clamped between two connection contacts 4, 5. To this end, the connection contacts 4, 5, in particular the contact regions 6 thereof, are bent outward for example. After the partial bodies 2 are arranged between the connection contacts 4, 5, the connection contacts 4, 5 are released again, so that the connection contacts 4, 5 spring back and the partial bodies 2 are clamped. As an alternative or in addition thereto, the base 3 can also be bent, in order to bend the connection contacts 4, 5 outward and to arrange the partial bodies 2 between the connection contacts 4, 5 in a clamping manner.

In a step Y, the partial bodies 2 are further fastened to the connection contacts 4, 5, for example by soldering or sintering. In particular, a contact means, for example a soldering or sintering material, can already be applied to the partial bodies 2 and/or the connection contacts 4, 5 before the partial bodies 2 are arranged between the connection contacts 4, 5.

After the partial bodies 2 are arranged between the connection contacts 4, 5, heating is performed, so that the soldering material is melted or a sintering material is sintered. The electrical contact between the partial bodies 2 and the connection contacts 4, 5 can be ensured in this way. By way of example, a low-temperature sintering process, in particular at a temperature in the region of 250° C., is carried out for connection purposes.

In a step C, the component is separated into smaller components of a desired size, in particular with a desired number of partial bodies 2. To this end, the component 1 is separated by a cut along a plane between two adjoining partial bodies 2. Owing to the configuration of the connection contacts 4, 5 with a large number of partial contacts 7 and partial connections 10, in particular a partial contact 7 and a partial connection 10 for each partial body 2, separation in any desired manner is possible while maintaining the contact-connection for each partial body 2.

As an alternative, separation can also already be performed before the partial bodies 2 are arranged between the connection contacts 4, 5. To this end, after step B, a cut is made in a plane between adjacent partial contacts 7 in a step C. The partial bodies 2 are then arranged between the connection contacts 4, 5 in accordance with step X and additionally fastened in accordance with step Y.

LIST OF REFERENCE SYMBOLS

1 Component
2 Partial body
3 Base
4 Connection contact
5 Connection contact
6 Contact region
7 Partial contact
8 Connecting region
9 Connection region
10 Partial connection
11 Air gap
12 Component arrangement
13 Carrier
14 Contact point
15 Connecting material
16 Base material
17 Further layer
18 Further layer
19 Web
20 Cutout
21 Main body
22 Smaller component
23 Smaller component

The invention claimed is:

1. An electrical component, comprising:
a plurality of bodies, a base on which the bodies are arranged, wherein each of the plurality of bodies has a first side face and a second side face opposite to the first side face;
and first and second connection contacts for electrically connecting the bodies to a carrier, wherein a first connection contact of the first and second connection contacts is located at the first side face of one of the bodies and is fixed to the first side face by a solder or sintering material and wherein a second connection contact of the first and second connection contacts is located at the second side face thereof and is fixed to the second side face by a solder or sintering material;
in which the first connection contact has a plurality of first contact portions connected to each other, and in which the second connection contact has a plurality of second contact portions connected to each other, wherein each of the plurality of first contact portions and each of the plurality of second contact portions make contact with one of the bodies, wherein adjacent ones of the plurality of first contact portions are connected to each other only by a first thin link, wherein adjacent ones of the plurality of second contact portions are connected to each other only by a second thin link,
wherein the electrical component is separable into smaller electrical components by cutting along a plane between two of the bodies and, thereby, between two of the first contact portions and between two of the second contact portions, thereby breaking the first thin link between the two of the first contact portions and breaking the second thin link between the two of the second contact portions, wherein each of the smaller electrical components has at least one body arranged on a portion of the base and is located between a portion of the first connection contact and a portion of the second connection contact.

2. The electrical component according to claim 1, in which the bodies are not fastened to one another.

3. The electrical component according to claim 2, in which at least one of the first and second connection contacts is guided through the base.

4. The electrical component according to claim 2, in which at least one of the first and second connection contacts is designed for SMD or pin mounting.

5. The electrical component according to claim 1, in which each of the first and second connection contacts is guided through the base.

6. The electrical component according to claim 1, in which each of the first and second connection contacts is designed for SMD or pin mounting.

7. The electrical component according to claim 1, in which each of the first and second connection contacts has a plurality of connection portions for electrical connection to the carrier.

8. The electrical component according to claim 1, in which each of the first and second connection contacts comprises a first material and a second material which is arranged on said first material, in which the first material comprises copper and the second material comprises Invar.

9. A component arrangement comprising the electrical component according to claim 1 and the carrier to which the electrical component is fastened.

10. The electrical component according to claim 1, wherein the base comprises a non-conductive material.

11. The electrical component according to claim 1, wherein the first connection contact has at least one first contact region for fastening the first connection contact to the carrier and wherein the second connection contact has at least one second contact region for fastening the second connection contact to the carrier, wherein the base is located between the plurality of bodies and the first contact regions and is located between the plurality of bodies and the second contact regions.

12. The electrical component according to claim 1, wherein the base is shaped as a plate having an entirely plain surface on which the plurality of bodies is located.

13. The electrical component according to claim 1, wherein the first and second connection contacts are guided around the base.

14. A method for producing a component having a plurality of bodies, a base on which the bodies are arranged, and a first connection contact and a second connection contact for electrically connecting the bodies to a carrier, comprising the step of:

providing a larger electrical component having a plurality of bodies, a base on which the bodies are arranged and first and second connection contacts, the first connection contact having a plurality of first contact portions connected to each other, and in which the second connection contact has a plurality of second contact portions connected to each other, each of the plurality of first contact portions making contact with one of the bodies and each of the plurality of second contact portions making contact with one of the bodies, and adjacent first contact portions being connected to each other only by a first thin link and adjacent second contact portions being connected to each other only by a second thin link, wherein each of the bodies has first and second side faces opposite to each other, wherein the first connection contact is located at the first side face and is fixed to the first side face by a solder or sintering material and wherein the second connection contact is located at the second side face and is fixed to the second side face by a solder or sintering material, wherein the electrical component is separable into smaller electrical components, by cutting along a plane between two of the bodies and, thereby, between two of the first contact portions and between two of the second contact portions, thereby breaking the first thin link between the two of the first contact portions and breaking the second thin link between the two of the second contact portions, and wherein each of the smaller electrical components has at least one body arranged on a portion of the base and is connected to a portion of the first connection contact and to a portion of the second connection contact.

* * * * *